(12) United States Patent
Sone et al.

(10) Patent No.: US 12,359,314 B2
(45) Date of Patent: Jul. 15, 2025

(54) METHOD OF MANUFACTURING SEMICONDUCTOR DEVICE, SUBSTRATE PROCESSING METHOD, SUBSTRATE PROCESSING APPARATUS, AND RECORDING MEDIUM

(71) Applicant: KOKUSAI ELECTRIC CORPORATION, Tokyo (JP)

(72) Inventors: Shin Sone, Toyama (JP); Ryota Horiike, Toyama (JP); Hiroki Hatta, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 843 days.

(21) Appl. No.: 17/372,363

(22) Filed: Jul. 9, 2021

(65) Prior Publication Data
US 2021/0332477 A1 Oct. 28, 2021

Related U.S. Application Data

(63) Continuation of application No. PCT/JP2019/049987, filed on Dec. 20, 2019.

(30) Foreign Application Priority Data

Jan. 11, 2019 (JP) .................. 2019-003056

(51) Int. Cl.
*C23C 16/44* (2006.01)
*C23C 16/455* (2006.01)
*H01L 21/02* (2006.01)

(52) U.S. Cl.
CPC .... *C23C 16/4408* (2013.01); *C23C 16/45557* (2013.01); *H01L 21/02167* (2013.01); *H01L 21/0217* (2013.01); *H01L 21/02334* (2013.01)

(58) Field of Classification Search
CPC .................................................. H01L 21/0217
See application file for complete search history.

(56) References Cited

U.S. PATENT DOCUMENTS

| 2003/0068437 A1 | 4/2003 | Nakamura et al. |
| 2004/0192036 A1 | 9/2004 | Koyanagi et al. |

(Continued)

FOREIGN PATENT DOCUMENTS

| CN | 1534741 A | 10/2004 |
| JP | 2001-148381 A | 5/2001 |

(Continued)

OTHER PUBLICATIONS

Japanese Office Action issued on May 10, 2022 for Japanese Patent Application No. 2020-565673.

(Continued)

*Primary Examiner* — Austin Murata
(74) *Attorney, Agent, or Firm* — Volpe Koenig

(57) ABSTRACT

There is included (a) modifying a film formed on a substrate in a process chamber set at a first pressure by supplying a gas containing hydrogen and oxygen to the film; (b) purging an interior of the process chamber by supplying an inert gas into the process chamber and exhausting the interior of the process chamber, at a second pressure at which the gas containing hydrogen and oxygen remaining in the process chamber after performing (a) is maintained in a gaseous state; and (c) vacuuming the interior of the process chamber so as to reduce a pressure of the interior of the process chamber after performing (b) to a third pressure lower than the second pressure.

17 Claims, 5 Drawing Sheets

(56) References Cited

U.S. PATENT DOCUMENTS

| | | | |
|---|---|---|---|
| 2006/0030165 A1* | 2/2006 | Ingle | H01L 21/02164 |
| | | | 257/E21.546 |
| 2009/0008369 A1* | 1/2009 | Nozawa | H01J 37/32834 |
| | | | 219/121.54 |
| 2010/0035423 A1* | 2/2010 | Clark | H01L 21/28185 |
| | | | 438/585 |
| 2014/0295675 A1* | 10/2014 | Ikeuchi | H01L 21/67109 |
| | | | 118/704 |
| 2015/0044880 A1 | 2/2015 | Noda et al. | |
| 2016/0362784 A1 | 12/2016 | Isobe et al. | |
| 2017/0087606 A1 | 3/2017 | Nakamura et al. | |
| 2018/0023192 A1 | 1/2018 | Chandra et al. | |
| 2018/0076030 A1 | 3/2018 | Yamada et al. | |
| 2018/0204732 A1 | 7/2018 | Kamakura et al. | |
| 2020/0071819 A1* | 3/2020 | Lei | C23C 16/401 |

FOREIGN PATENT DOCUMENTS

| | | |
|---|---|---|
| JP | 2004-296814 A | 10/2004 |
| JP | 2005-229028 A | 8/2005 |
| JP | 2011-134793 A | 7/2011 |
| JP | 2017-005090 A | 1/2017 |
| JP | 2018-046175 A | 3/2018 |
| JP | 2018-506185 A | 3/2018 |
| KR | 10-2001-0030252 A | 4/2001 |
| KR | 10-2018-0038473 A | 4/2018 |
| TW | 541619 B | 7/2003 |
| TW | 201720541 A | 6/2017 |
| WO | 2013/146632 A1 | 10/2013 |
| WO | 2017/046921 A1 | 3/2017 |

OTHER PUBLICATIONS

Singapore Written Opinion issued on Jul. 17, 2022 for Singapore Patent Application No. 11202107574S.
Korean Office Action issued on Jul. 14, 2023 for Korean Patent Application No. 10-2021-7021597.
International Search Report and English Translation, PCT/JP2019/049987, Mar. 17, 2020 (6 pgs.).
Taiwan Office Action, TW Appln. No. 04072/10921250150, Dec. 24, 2020.
Chinese Office Action issued on Jul. 25, 2023 for Chinese Patent Application No. 201980080707.9.

* cited by examiner

METHOD OF MANUFACTURING SEMICONDUCTOR DEVICE, SUBSTRATE PROCESSING METHOD, SUBSTRATE PROCESSING APPARATUS, AND RECORDING MEDIUM

CROSS-REFERENCE TO RELATED APPLICATION

The application is a Bypass Continuation Application of PCT International Application No. PCT/JP2019/049987, filed on Dec. 20, 2019 and designating the United States, the international application being based upon and claiming the benefit of priority from Japanese Patent Application No. 2019-003056, filed on Jan. 11, 2019, the entire content of which is incorporated herein by reference.

TECHNICAL FIELD

The present disclosure relates to a method of manufacturing a semiconductor device, a substrate processing method, a substrate processing apparatus, and a recording medium.

BACKGROUND

As one step in a manufacturing process of a semiconductor device, a process of forming a film such as a silicon oxide film (SiO film) or the like on a substrate may be performed by using a gas containing hydrogen and oxygen, such as a $H_2O$ gas or the like.

SUMMARY

Some embodiments of the present disclosure provide a technique capable of suppressing the generation of foreign substances caused by a gas containing hydrogen and oxygen.

According to some embodiments of the present disclosure, there is provided a technique that includes:
  (a) modifying a film formed on a substrate in a process chamber set at a first pressure by supplying a gas containing hydrogen and oxygen to the film;
  (b) purging an interior of the process chamber by supplying an inert gas into the process chamber and exhausting the interior of the process chamber, at a second pressure at which the gas containing hydrogen and oxygen remaining in the process chamber after performing (a) is maintained in a gaseous state; and
  (c) vacuuming the interior of the process chamber so as to reduce a pressure of the interior of the process chamber after performing (b) to a third pressure lower than the second pressure.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In recent years, there has been a demand for lowering a processing temperature in a manufacturing process of semiconductor devices. Along with this, research is being conducted not only on a film-forming process for forming a film on a wafer as a substrate, but also on a modifying process for improving film characteristics.

When low-temperature film formation or film modification is performed, there may be a case of performing a step of supplying a $H_2O$ gas (moisture) as a gas containing hydrogen (H) and oxygen (O) to the film in a process chamber. After the step of supplying the $H_2O$ gas is performed, in order to quickly remove the water remaining in the process chamber, vacuuming (depressurization exhaust) of the process chamber may be performed immediately after the step of supplying the $H_2O$ gas. At this time, $H_2O$ vaporized once may be liquefied or solidified under a reduced pressure condition to thereby generate water droplets or ice. The present disclosers have found that there is a problem that foreign substances are physically generated due to film peeling caused by the water droplets or ice colliding with the films formed on the surfaces of wafers and the surfaces of boat pillars of a boat supporting the wafers.

Against the above-mentioned problem, the present disclosers have found that foreign substances due to a phase change of the $H_2O$ gas can be reduced by, after the $H_2O$ gas is supplied during the film-forming process or after the film-forming process, replacing an interior of the process chamber with a nitrogen ($N_2$) gas in a state in which a set pressure of the interior of the process chamber at the time of supplying the $H_2O$ gas is maintained as it is (hereinafter referred to as same-pressure $N_2$ purging or same-pressure $N_2$ replacement), and then vacuuming the interior of the process chamber and reducing the pressure of the interior of the process chamber. The present disclosure is based on the above findings found by the present disclosers.

One Embodiment of the Present Disclosure

Hereinafter, one embodiment of the present disclosure will be described with reference to FIGS. 1 to 5.

(1) Configuration of Substrate Processing Apparatus

Figure 1:
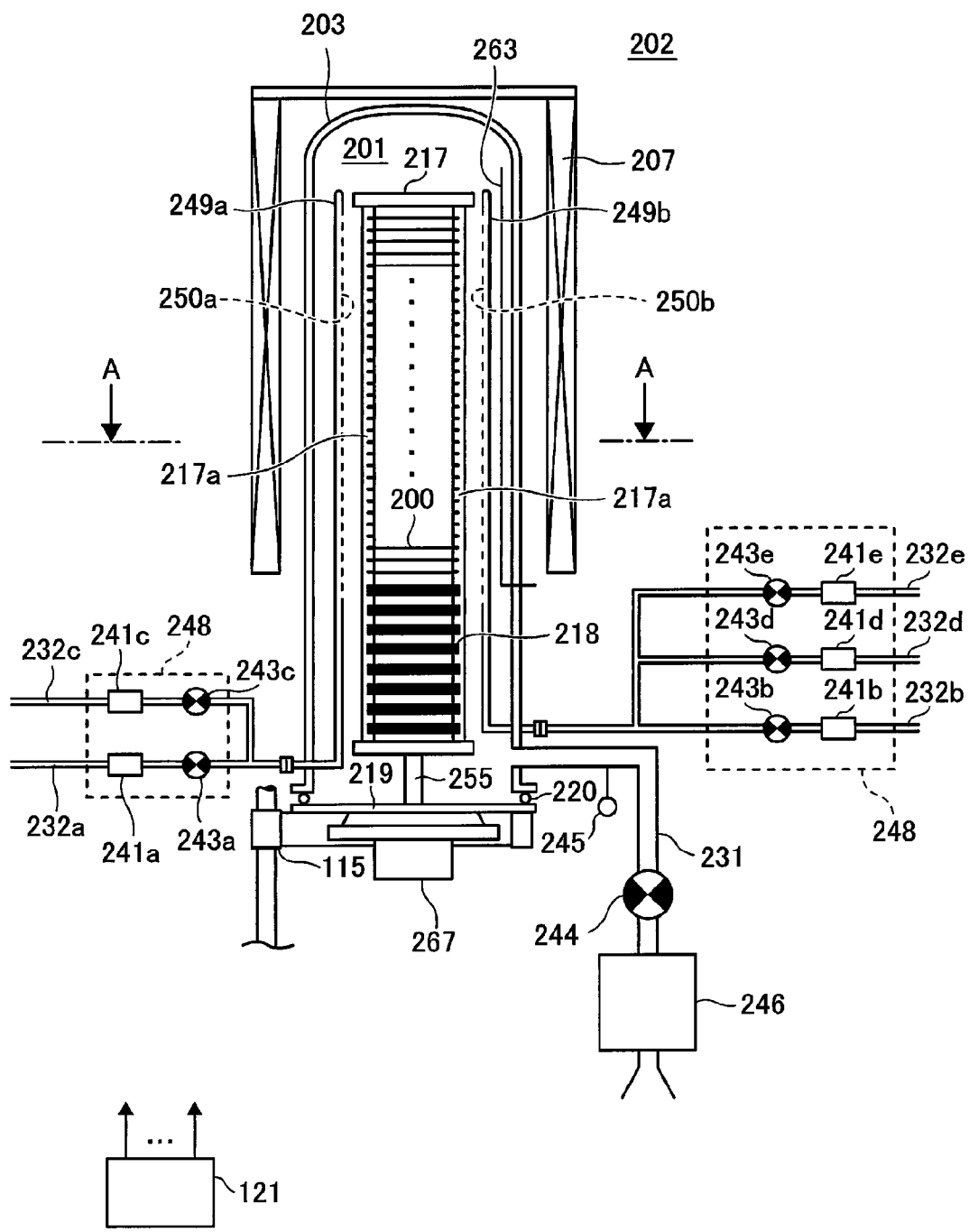
FIG. 1 is a schematic configuration view of a vertical process furnace of a substrate processing apparatus suitably used in an embodiment of the present disclosure, in which the portion of the process furnace is illustrated in a vertical cross-sectional view.

As shown in FIG. 1, a process furnace 202 includes a heater 207 as a heating mechanism (temperature adjustment part). The heater 207 has a cylindrical shape and is vertically installed by being supported on a holding plate. The heater 207 also functions as an activation mechanism (excitation part) for activating (exciting) a gas with heat.

Inside the heater 207, a reaction tube 203 is arranged concentrically with the heater 207. The reaction tube 203 is made of a heat-resistant material such as quartz ($SiO_2$) or silicon carbide (SiC), and is formed in a cylindrical shape with the upper end thereof closed and the lower end thereof opened. A process chamber 201 is formed in the hollow portion of the reaction tube 203. The process chamber 201 is configured to accommodate wafers 200 as substrates.

Nozzles 249a and 249b are installed in the process chamber 201 so as to penetrate the lower side wall of the reaction tube 203. Gas supply pipes 232a and 232b are connected to the nozzles 249a and 249b, respectively.

In the gas supply pipes 232a and 232b, mass flow controllers (MFCs) 241a and 241b, which are flow rate controllers (flow rate control parts), and valves 243a and 243b, which are opening/closing valves, are installed, respectively, sequentially from the upstream side of a gas flow. A gas supply pipe 232c is connected to the gas supply pipe 232a on the downstream side of the valve 243a. Gas supply pipes 232d and 232e are connected to the gas supply pipe 232b at the downstream side of the valve 243b. In the gas supply pipes 232c, 232d and 232e, MFCs 241c, 241d and 241e and valves 243c, 243d and 243e are respectively installed sequentially from the upstream side of the gas flow.

Figure 2:
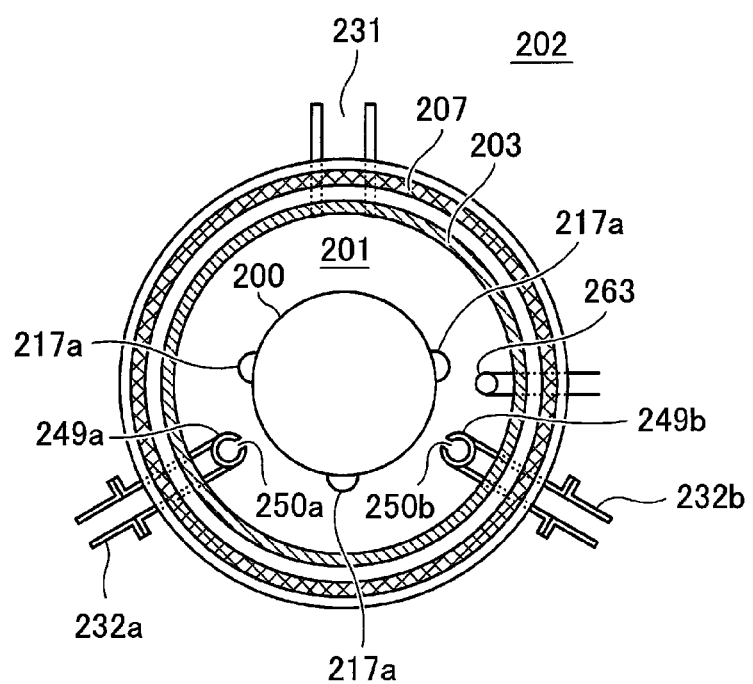
FIG. 2 is a schematic configuration view of the vertical process furnace of the substrate processing apparatus suitably used in an embodiment of the present disclosure, in which a portion of the process furnace is illustrated in a cross-sectional view taken along an A-A line in FIG. 1.

As shown in FIG. 2, the nozzles 249a and 249b are respectively installed at a space, which has an annular shape in a plane view, between the inner wall of the reaction tube 203 and the wafers 200 so as to extend upward in the arrangement direction of the wafers 200 along the inner wall of the reaction tube 203 from the lower portion to the upper portion of the reaction tube 203. That is, the nozzles 249a and 249b are respectively installed at the lateral side of the wafer arrangement region at which the wafers 200 are arranged, namely at a region horizontally surrounding the wafer arrangement region, so as to extend along the wafer arrangement region. Gas supply holes 250a and 250b for supplying gases are installed at the side surfaces of the nozzles 249a and 249b, respectively. The gas supply holes 250a and 250b are opened so as to face the center of the reaction tube 203 to allow the gas to be supplied toward the wafers 200. The gas supply holes 250a and 250b are installed in a plural number between a lower portion of the reaction tube 203 and an upper portion of the reaction tube 203.

Figure 5:
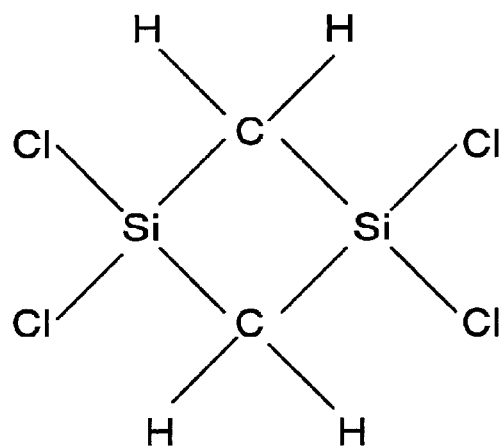
FIG. 5 is a diagram showing a chemical structural formula of 1,1,3,3-tetrachloro-1,3-disilacyclobutane used as a precursor.

From the gas supply pipe 232a, a precursor (precursor gas), for example, a gas, which contains ring structures composed of silicon (Si) and carbon (C) and a halogen, is supplied into the process chamber 201 via the MFC 241a, the valve 243a, and the nozzle 249a. The precursor acts as a Si source and a C source. As the precursor, for example, a 1,1,3,3-tetrachloro-1,3-disilacyclobutane ($C_2H_4Cl_4Si_2$, abbreviation: TCDSCB) gas may be used. FIG. 5 shows the chemical structural formula of TCDSCB. TCDSCB contains a ring structure composed of Si and C and chlorine (Cl) as a halogen. Hereinafter, for the sake of convenience, the ring structure composed of Si and C is also simply referred to as a ring structure. The shape of the ring structure contained in TCDSCB is quadrangular. The ring structure is formed by alternately bonding Si and C. The ring structure contains four Si—C bonds, and contains two Si atoms and two C atoms. In this ring structure, Cl is bonded to Si, and H is bonded to C. That is, TCDSCB contains Si—Cl bonds and C—H bonds in addition to the Si—C bonds.

From the gas supply pipe 232b, as a reactant (reaction gas), for example, a nitrogen (N)-containing gas is supplied into the process chamber 201 via the MFC 241b, the valve 243b and the nozzle 249b. As the N-containing gas, for example, a hydrogen nitride-based gas, which is a nitriding agent (nitriding gas), may be used. The hydrogen nitride-based gas contains N and H, and can be referred to as a substance composed of only two elements of N and H. The hydrogen nitride-based gas acts as a N source. As the hydrogen nitride-based gas, for example, an ammonia ($NH_3$) gas may be used.

From the gas supply pipes 232c and 232d, a nitrogen ($N_2$) gas as an inert gas is supplied into the process chamber 201 via the MFCs 241c and 241d, the valves 243c and 243d, the gas supply pipes 232a and 232b, and the nozzles 249a and 249b, respectively. The $N_2$ gas acts as a purge gas, a carrier gas, a dilution gas, and the like.

From the gas supply pipe 232e, a gas containing H and O is supplied into the process chamber 201 via the MFC 241e, the valve 243e, the gas supply pipe 232b, and the nozzle 249b. The gas containing H and O acts as an oxidizing agent (oxidizing gas), that is, an O source. As the gas containing H and O, for example, water vapor ($H_2O$ gas) may be used.

A precursor supply system is mainly constituted by the gas supply pipe 232a, the MFC 241a, and the valve 243a. A nitriding agent supply system is mainly constituted by the gas supply pipe 232b, the MFC 241b, and the valve 243b. An H- and and O-containing gas supply system is mainly constituted by the gas supply pipe 232e, the MFC 241e, and the valve 243e. An inert gas supply system is mainly constituted by the gas supply pipes 232c and 232d, the MFC241c and 241d, and the valves 243c and 243d.

Some or all of the various supply systems described above may be configured as an integrated supply system 248 in which the valves 243a to 243e, the MFC 241a to 241e and the like are integrated. The integrated supply system 248 is connected to each of the gas supply pipes 232a to 232e, and is configured so that the operations of supplying various gases into the gas supply pipes 232a to 232e, i.e., the opening/closing operations of the valves 243a to 243e, the flow rate adjustment operations by the MFCs 241a to 241e, and the like are controlled by a controller 121 described later. The integrated supply system 248 is configured as a one piece type or division-type integrated unit, and is configured so that it can be attached to and detached from the gas supply pipes 232a to 232e on the integrated unit basis and so that the maintenance, replacement, expansion, and the like can be performed on an integrated unit basis.

An exhaust pipe 231 that exhausts the gas in the process chamber 201 is connected to the lower portion of the side wall of the reaction tube 203. A vacuum pump 246 as evacuation vacuum-exhausting device is connected to the exhaust pipe 231 via a pressure sensor 245 as a pressure detector (pressure detection part) for detecting the pressure in the process chamber 201 and an APC (Auto Pressure Controller) valve 244 as a pressure controller (exhaust valve). The APC valve 244 is configured to perform or stop the vacuum-exhausting operation for the in the process chamber 201 by opening and closing the APC valve 244 while operating the vacuum pump 246, and is also configured to control (regulate) the pressure of the interior of the process chamber 201 by adjusting the valve opening degree of the APC valve 244 based on the pressure information detected by the pressure sensor 245 while operating the vacuum pump 246. An exhaust system is mainly constituted by the exhaust pipe 231, the pressure sensor 245 and the APC valve 244. The vacuum pump 246 may be included in the exhaust system.

Below the reaction tube 203, a seal cap 219 as a furnace opening lid configured to seal the lower end opening of the reaction tube 203, is installed. The seal cap 219 is made of a metallic material such as, for example, stainless steel or the like and is formed in a disk shape. An O-ring 220 as a sealing member that comes into contact with the lower end of the reaction tube 203 is installed on the upper surface of the seal cap 219. Below the seal cap 219, a rotation mechanism 267 for rotating a boat 217, which will be described later, is provided. The rotating shaft 255 of the rotation mechanism 267 penetrates the seal cap 219 and is connected to the boat 217. The rotation mechanism 267 is configured to rotate the wafers 200 by rotating the boat 217. The seal cap 219 is configured to be vertically raised or lowered by a boat elevator 115 as an elevating mechanism provided outside the reaction tube 203. The boat elevator 115 is configured as a transfer device (transfer mechanism) for loading and unloading (transferring) the wafers 200 into and out of the process chamber 201 by raising and lowering the seal cap 219.

A boat 217 as a substrate support tool is provided with boat pillars 217a as a plurality of substrate holding pillars, and is configured so as to, by a plurality of support grooves installed at each of the boat pillars 217a, support a plurality of wafers 200, for example, 25 to 200 wafers 200 in a horizontal posture and in multiple stages while vertically arranging the wafers 200 with the centers thereof aligned with each other, i.e., so as to arrange the wafers 200 at intervals. The boat 217 is made of a heat-resistant material such as, for example, quartz or SiC. Heat insulating plates 218 made of a heat-resistant material such as, for example, quartz or SiC, are supported in a horizontal posture and in multiple stages at the bottom of the boat 217.

Inside the reaction tube 203, there is provided a temperature sensor 263 as a temperature detector. By adjusting the state of supply of electric power to the heater 207 based on the temperature information detected by the temperature sensor 263, the temperature of the interior of the process chamber 201 becomes a desired temperature distribution. The temperature sensor 263 is installed along the inner wall of the reaction tube 203.

Figure 3:
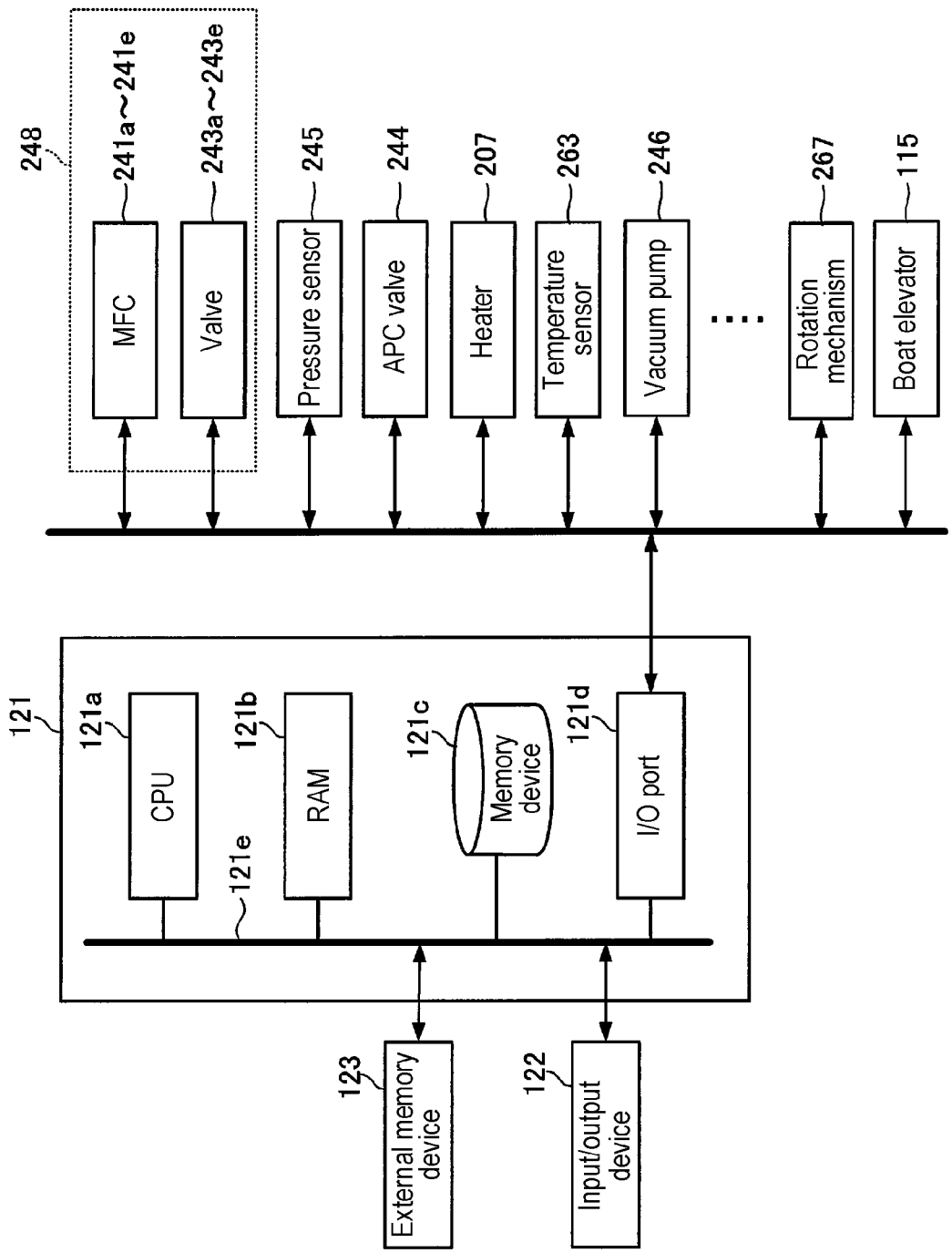
FIG. 3 is a schematic configuration diagram of a controller of the substrate processing apparatus suitably used in an embodiment of the present disclosure, in which a control system of the controller is illustrated in a block diagram.

As shown in FIG. 3, the controller 121 as a control part (control means) is configured as a computer including a CPU (Central Processing Unit) 121a, a RAM (Random Access Memory) 121b, a memory device 121c and an I/O port 121d. The RAM 121b, the memory device 121c and the I/O port 121d are configured to exchange data with the CPU 121a via an internal bus 121e. An input/output device 122 configured as, for example, a touch panel or the like is connected to the controller 121.

The memory device 121c is configured by, for example, a flash memory, an HDD (Hard Disk Drive), or the like. A control program for controlling operations of the substrate processing apparatus, a process recipe in which procedures and conditions of substrate processing to be described later are written, and the like, are readably stored in the memory device 121c. The process recipe is a combination for causing the controller 121 to execute the respective procedures in a below-described substrate processing process so as to obtain a predetermined result. The process recipe functions as a program. Hereinafter, the process recipe, the control program and the like are collectively and simply referred to as a program. Furthermore, the process recipe is also simply referred to as a recipe. When the term "program" is used herein, it may mean a case of including only the recipe, a case of including only the control program, or a case of including both the recipe and the control program. The RAM 121b is configured as a memory area (work area) in which programs, data and the like read by the CPU 121a are temporarily held.

The I/O port 121d is connected to the MFCs 241a to 241e, the valves 243a to 243e, the pressure sensor 245, the APC valve 244, the heater 207, the temperature sensor 263, the vacuum pump 246, the rotation mechanism 267, the boat elevator 115, and the like.

The CPU 121a is configured to read the control program from the memory device 121c and execute the read control program, and is configured to read the recipe from the memory device 121c in response to an input of an operation command from the input/output device 122 or the like. The CPU 121a is configured to be capable of, according to the contents of the recipe thus read, controlling the flow rate adjustment operation for various gases by the MFCs 241a to 241e, the opening and closing operations of the valves 243a to 243e, the opening and closing operation of the APC valve 244, the pressure regulation operation by the APC valve 244 based on the pressure sensor 245, the start and stop of the vacuum pump 246, the temperature adjustment operation of the heater 207 based on the temperature sensor 263, the rotation and the rotation speed adjustment operation of the boat 217 by the rotation mechanism 267, the raising and lowering operation of the boat 217 by the boat elevator 115, and the like.

The controller 121 may be configured by installing, on the computer, the above-described program stored in an external memory device 123. The external memory device 123 includes, for example, a magnetic disk such as an HDD or the like, an optical disk such as a CD or the like, a magneto-optical disk such as an MO or the like, a semiconductor memory such as a USB memory or the like, and so forth. The memory device 121c and the external memory device 123 are configured as a computer readable recording medium. Hereinafter, the memory device 121c and the external memory device 123 are collectively and simply referred to as a recording medium. As used herein, the term "recording medium" may include only the memory device 121c, only the external memory device 123, or both. The provision of the program to the computer may be performed by using a communication means such as the Internet or a dedicated line without having to use the external memory device 123.

(2) Substrate Processing Process

A substrate processing sequence example of forming and modifying a desired film on a wafer 200 as a substrate by using the above-described substrate processing apparatus, which is a process of manufacturing a semiconductor device, will be described mainly with reference to FIG. 4. In the following descriptions, the operations of the respective parts constituting the substrate processing apparatus are controlled by the controller 121.

Figure 4:
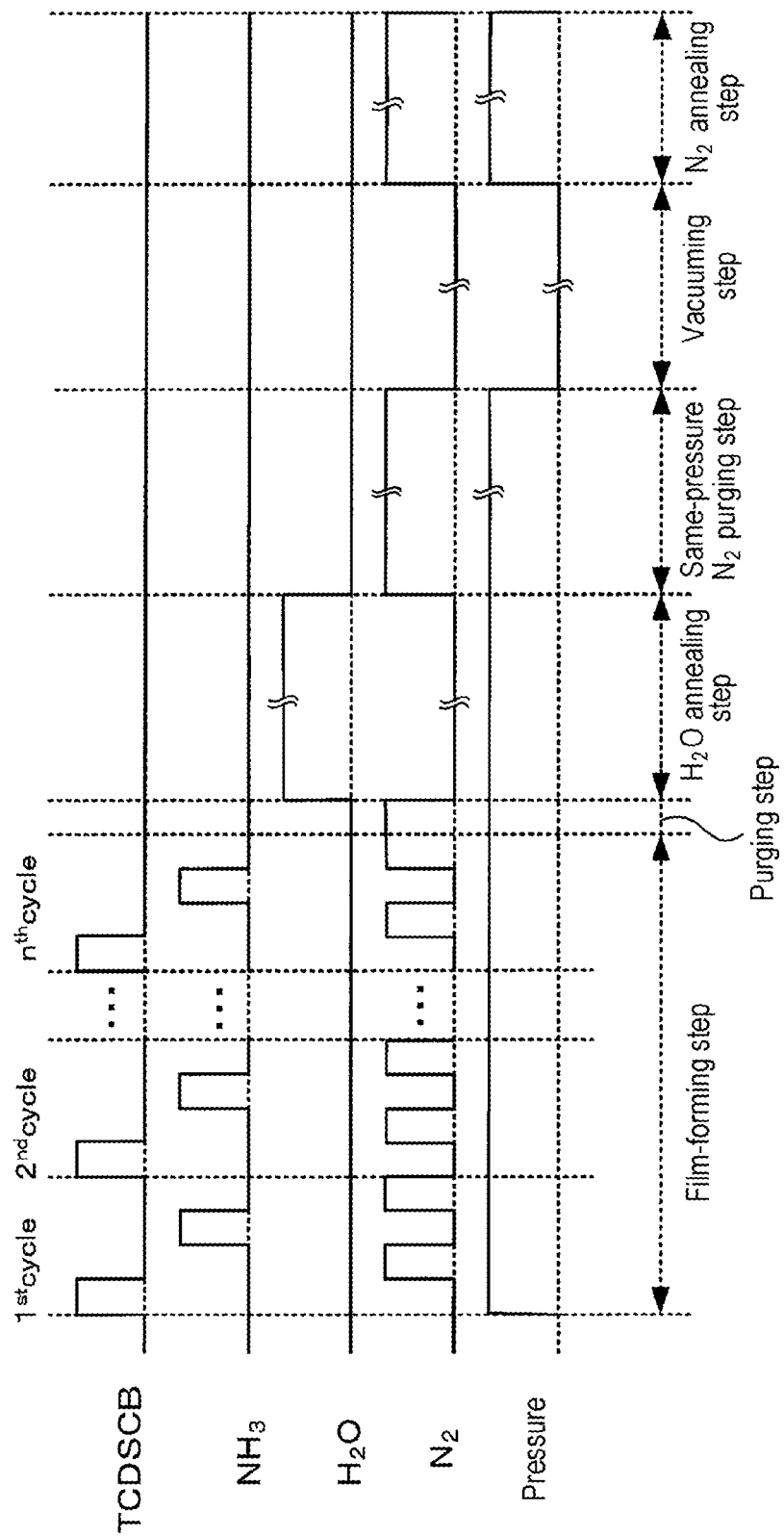
FIG. 4 is a flowchart showing a substrate processing sequence according to one embodiment of the present disclosure.

In the substrate processing sequence shown in FIG. 4, there are performed:

an $H_2O$ annealing step of modifying a film formed on the wafer 200 in the process chamber 201 set at a first pressure by supplying an $H_2O$ gas as a gas containing H and O to the film;

a same-pressure $N_2$ purging step of purging the interior of the process chamber 201 by supplying an $N_2$ gas as an inert gas into the process chamber 201 and exhausting the interior of the process chamber 201, at a second pressure at which the $H_2O$ gas remaining in the process chamber 201 after performing the $H_2O$ annealing step is maintained in a gaseous state; and a vacuuming step of vacuuming the interior of the process chamber 201 so as to reduce a pressure in the process chamber 201 after the same-pressure $N_2$ purging step to a third pressure lower than the second pressure.

In addition, after performing the vacuuming step, an $N_2$ annealing step of thermally annealing the film after being modified is further performed.

Further, a film-forming step of forming a SiCN film containing a ring structure composed of Si and C, and N, as a film, on the wafer 200 is performed by performing a cycle a predetermined number of times, the cycle including non-simultaneously performing: step 1 of supplying a TCDSCB gas as a precursor gas containing a ring structure composed of Si and C and Cl as halogen to the wafer 200 in the process chamber 201 before performing the $H_2O$ annealing step; and step 2 of supplying an $NH_3$ gas, which is a nitriding agent, as a reaction gas to the wafer 200. A gas that contributes to the substrate processing, such as the precursor gas, the reaction gas and the like, are also collectively referred to as a processing gas.

In this substrate processing sequence, the SiCN film is modified into a SiOCN film or a SiOC film in the $H_2O$ annealing step performed after the film-forming step. For the sake of convenience, the SiOCN film or the SiOC film is also referred to as a SiOC (N) film. The SiOC (N) film may be a film containing a ring structure composed of at least Si and C, and O.

Each of the film-forming step, the $H_2O$ annealing step, the same-pressure $N_2$ purging step, the vacuum evacuation step, and the $N_2$ annealing step is performed in a non-plasma atmosphere. By performing each step in the non-plasma atmosphere, it is possible to perform the reaction or the like, which is generated in each step, with high precision, and to increase the controllability of the process performed in each step.

In the present disclosure, for the sake of convenience, the substrate processing sequence shown in FIG. 4 may be denoted as follows. The same notation will also be used in the following descriptions of modifications and the like.

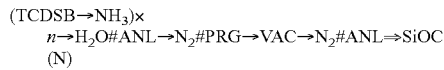

When the term "wafer" is used in the present disclosure, it may refer to a wafer itself or a laminated body of a wafer and a predetermined layer or film formed on the surface of the wafer. When the phrase "a surface of a wafer" is used in the present disclosure, it may refer to a surface of a wafer itself or a surface of a predetermined layer or the like formed on a wafer. When the expression "a predetermined layer is formed on a wafer" is used in the present disclosure, it may mean that a predetermined layer is directly formed on a surface of a wafer itself or that a predetermined layer is formed on a layer or the like formed on a wafer. When the term "substrate" is used in the present disclosure, it may be synonymous with the term "wafer."

Wafer Charging and Boat Loading

A plurality of wafers 200 is charged to the boat 217 (wafer charging). Thereafter, as shown in FIG. 1, the boat 217 supporting the plurality of wafers 200 is lifted by the boat elevator 115 and loaded into the process chamber 201 (boat loading). In this state, the seal cap 219 seals the lower end of the reaction tube 203 via the O-ring 220.

Pressure Regulation and Temperature Adjustment

The interior of the process chamber 201, namely, the space where the wafers 200 exist, is vacuum-exhausted (depressurization-exhausted) by the vacuum pump 246 so as to reach a desired pressure (degree of vacuum). At this time, the internal pressure of the process chamber 201 is measured by the pressure sensor 245, and the APC valve 244 is feedback-controlled based on the measured pressure information. Further, the wafers 200 in the process chamber 201 are heated by the heater 207 so as to have a desired processing temperature. At this time, the amount of electric power supplied to the heater 207 is feedback-controlled based on the temperature information detected by the temperature sensor 263 such that the interior of the process chamber 201 has a desired temperature distribution. Further, starts the rotation of the wafers 200 by the rotation mechanism 267 begins. The operation of the vacuum pump 246 and the heating and rotation of the wafers 200 are continuously performed at least until the processing of the wafers 200 is completed.

Film-Forming Step

Thereafter, the following steps 1 and 2 are sequentially carried out.

Step 1

In this step, a TCDSCB gas is supplied as a precursor to the wafers 200 accommodated in the process chamber 201. Specifically, the valve 243a is opened to allow the TCDSCB gas to flow into the gas supply pipe 232a. The flow rate of the TCDSCB gas is adjusted by the MFC 241a. The TCDSCB gas is supplied into the process chamber 201 via the nozzle 249a, and is exhausted from the exhaust pipe 231. At this time, the TCDSCB gas is supplied to the wafers 200. At this time, the valves 243c and 243d may be opened to allow an $N_2$ gas to flow into the gas supply pipes 232c and 232d.

An example of a processing condition in this step is described as follows:

Processing temperature: 200 to 400 degrees C., specifically 250 to 350 degrees C.

Processing pressure: 133 to 2,666 Pa

TCDSCB gas supply flow rate: 1 to 2,000 sccm $N_2$ gas supply flow rate (each gas supply pipe): 0 to 10,000 sccm Each gas supply time: 1 to 120 seconds, specifically 5 to 60 seconds The notation of a numerical range such as "200 to 400 degrees C." in the present disclosure means that a lower limit value and an upper limit value are included in the range. For example, "200 to 400 degrees C." means "200 degrees C. or higher and 400 degrees C. or lower." The same applies to other numerical ranges.

The aforementioned processing conditions, particularly the temperature condition, is a condition in which at least a part of ring structures contained in TCDSCB and composed of Si and C can be retained (maintained) as it is without being destroyed. That is, the aforementioned processing condition is a condition in which at least a part of ring structures contained in the TCDSCB gas (in a plurality of TCDSCB molecules) supplied to the wafers 200 is maintained as it is without being destroyed. In other words, the aforementioned processing condition is a condition in which at least a part of Si—C bonds constituting a plurality of ring structures contained in the TCDSCB gas supplied to the wafers 200 is maintained as it is. As described above, in the present disclosure, the ring structure composed of Si and C is also simply referred to as a ring structure.

By supplying the TCDSCB gas to the wafers 200 under the aforementioned condition, a first layer (initial layer) containing ring structures and containing Cl as a halogen is formed on the outermost surface of the wafers 200. That is, as the first layer, a layer containing ring structures composed of Si and C, and Cl is formed. Among the plurality of ring structures contained in the TCDSCB gas, at least a part of the ring structures is introduced into the first layer as it is without being destroyed. In addition, the first layer may contain a chain structure formed by destroying a part of the plurality of Si—C bonds constituting the ring structure. Further, the first layer may contain at least one selected from the group of a Si—Cl bond and a C—H bond.

After forming the first layer on the wafer 200, the valve 243a is closed to stop the supply of the TCDSCB gas into the process chamber 201. Then, the interior of the process chamber 201 is vacuum-exhausted, and the gas and the like remaining in the process chamber 201 are removed from the interior of the process chamber 201. At this time, the valves 243c and 243d are opened to supply the $N_2$ gas into the process chamber 201. The $N_2$ gas acts as a purge gas.

As the precursor, a 1,1,3,3-tetrachloro-1,3-disilacyclopentane ($C_3H_6Cl_4Si_2$) gas or the like may be used in addition to the TCDSCB gas. That is, the shape of the ring structure contained in the precursor and composed of Si and C is not limited to the quadrangular shape. Furthermore, the ring structure is not limited to the case where Si and C are alternately bonded. Moreover, as the precursor, a 1,1,3,3-tetrafluoro-1,3-disilacyclobutane ($C_2H_4F_4Si_2$) gas or the like may also be used. That is, the halogen contained in the precursor is not limited to Cl, but may be fluorine (F), bromine (Br), iodine (I), or the like.

As the inert gas, in addition to the $N_2$ gas, various rare gases such as an Ar gas, a He gas, a Ne gas, a Xe gas and the like may be used. This point is the same as in step 2, the purging step, the $H_2O$ annealing step, the same-pressure $N_2$ purging step, the vacuuming step and the $N_2$ annealing step, which will be described later.

Step 2

After step 1 is completed, an $NH_3$ gas, which is a nitriding agent as a reactant, is supplied to the wafers 200 in the process chamber 201, namely, the first layer formed on the wafers 200. Specifically, the opening/closing control of the valves 243b to 243d is performed in the same procedure as the opening/closing control of the valves 243a, 243c and 243d in step 1. The flow rate of the $NH_3$ gas is adjusted by the MFC 241b. The $NH_3$ gas is supplied into the process chamber 201 via the nozzle 249b, and is exhausted from the exhaust pipe 231. At this time, the $NH_3$ gas is supplied to the wafers 200.

An example of a processing condition in this step is described as follows.

Processing temperature: 200 to 400 degrees C., specifically 250 to 350 degrees C.
Processing pressure: 133 to 3,999 Pa
$NH_3$ gas supply flow rate: 100 to 10,000 sccm
Gas supply time: 1 to 120 seconds Other processing condition is the same as the processing condition in step 1.

The aforementioned processing condition, particularly the temperature condition, is condition in which at least a part of ring structures contained in the first layer formed on the wafers 200 in step 1 and composed of Si and C can be retained (maintained) as it is without being destroyed. That is, the aforementioned processing condition is a condition in which at least a part of a plurality of ring structures contained in the first layer on the wafers 200 is maintained as it is without being destroyed. In other words, the aforementioned processing condition is a condition in which at least a part of a plurality of Si—C bonds constituting a plurality of ring structures contained in the first layer on the wafers 200 is maintained as it is without being cut. The Si—C bonds constituting the ring structure are strong, and thus it becomes a state in which C is difficult to be desorbed from Si.

By supplying the $NH_3$ gas to the wafers 200 under the above condition, at least a part of the first layer can be modified (nitrided). As a result, Cl, H, and the like can be desorbed from the first layer, and N contained in the $NH_3$ gas can be introduced into the first layer in a state in which H is bonded to N. That is, it becomes possible to bond N contained in the $NH_3$ gas to Si constituting the ring structures contained in the first layer in a state in which H is bonded to N. The Si—N bond bonded to Si in this NH state is weak, so that it becomes state in which N is easily desorbed from Si. By nitriding the first layer in this way, it is possible to convert the first layer, which is a layer containing the ring structures and Cl, into a second layer, which is a layer containing ring structures and N.

That is, by supplying the $NH_3$ gas to the wafers 200 under the aforementioned condition, it becomes possible to introduce (maintain) at least a part of the ring structures contained in the first layer into the second layer as it is without being destroyed. That is, it becomes possible to make the nitriding of the first layer unsaturated (unsaturated nitriding) such that at least a part of the ring structures contained in the first layer is left as it is. By nitriding the first layer, a silicon carbonitride layer (SiCN layer), which is a layer containing ring structures composed of Si and C and N, is formed as a second layer on the wafers 200. The SiCN layer is a layer containing Si, C, and N and not containing O. C contained in the second layer is introduced into the second layer while maintaining a ring structure composed of Si and C, and N contained in the second layer is introduced into the second layer in a state in which N is bonded to H. That is, it becomes a state in which C contained in the second layer is difficult to be desorbed due to the strong Si—C bond, and N contained in the second layer is easy to be desorbed due to the weak Si-bond.

After forming the second layer on the wafers 200, the valve 243b is closed to stop the supply of the $NH_3$ gas into the process chamber 201. Then, the gas and the like remaining in the process chamber 201 are removed from the process chamber 201 by the same process procedure as in step 1.

As the nitriding agent (N-containing gas), a diazene ($N_2H_2$) gas, a hydrazine ($N_2H_4$) gas, a $N_3H_8$ gas, a gas containing these compounds, or the like may be used in addition to the $NH_3$ gas.

Performed a Predetermined Number of Times

A SiCN film, which is a film containing a ring structure composed of Si and C and N, is formed as a first film on the wafers 200 by performing a cycle a predetermined number of times (n times where n is an integer of 1 or more), the cycle including alternately performing steps 1 and 2 non-simultaneously, namely, non-synchronously. It is desirable to repeat the aforementioned cycle a plurality of times. The first film (SiCN film) is a film containing Si, C, and N and not containing O. However, since Cl and N having a weak bond remain in the first film, the first film becomes a film that is easy to cause water absorption and adsorption.

Purging Step

After the film-forming step is completed, an $N_2$ gas is supplied into the process chamber 201 from each of the gas supply pipes 232c and 232d, and is exhausted from the exhaust pipe 231. As a result, the interior of the process chamber 201 is purged and the gas, the reaction by-products, or the like, which remains in the process chamber 201, is removed from the interior of the process chamber 201.

$H_2O$ Annealing Step

After the purging step is completed, in a state in which the wafers 200 with the first film formed on the surfaces thereof are accommodated in the process chamber 201, a $H_2O$ gas as a gas containing H and O is supplied to the wafers 200, namely, the SiCN film as the first film formed on the wafers 200 in the process chamber 201 at a first pressure. Specifically, a set pressure (pressure set value) of the interior of the process chamber 201 is set to a first pressure, and the opening/closing control of the valves 243e, 243c and 243d is performed in the same procedure as the opening/closing control of the valves 243a, 243c and 243d in step 1, while adjusting (changing) the opening degree of the APC valve 244, namely, controlling (adjusting) the pressure of the interior of the process chamber 201 such that the actual pressure of the interior of the process chamber 201 becomes the first pressure. The flow rate of the $H_2O$ gas is adjusted by the MFC 241e. The $H_2O$ gas is supplied into the process chamber 201 via the nozzle 249b, and is exhausted from the exhaust pipe 231. At this time, the $H_2O$ gas is supplied to the wafers 200.

An example of a processing condition in this step is described as follows.

Processing temperature: 200 to 600 degrees C., specifically 250 to 500 degrees C.
Processing pressure (first pressure): 1,333 to 101,325 Pa, specifically 53,329 to 101,325 Pa
$H_2O$ gas supply flow rate: 50 to 10,000 sccm
$H_2O$ gas supply time: 10 to 360 minutes, specifically 60 to 360 minutes Other processing condition is the same as the processing condition in step 1. It is desirable that the processing pressure (first pressure) in this step, namely, the pressure of the interior of the process chamber 201 in this step is set to be higher than the pressure of the interior of the process chamber 201 in the film-forming step.

The aforementioned processing condition, particularly the temperature condition and the pressure condition, is a condition in which N contained in the first film can be replaced with O while at least a part of the ring structures composed of Si and C and contained in the first film formed on the wafers 200 in the film-forming step is retained (maintained) without being destroyed. In this regard, when the processing temperature and the processing pressure are too high, the ring structures contained in the first film are broken, and C in the first film is easily desorbed. On the other hand, when the processing temperature and the processing pressure are too low, there may be a case that the reaction for replacing N contained in the first film with O is insufficient. Under the aforementioned processing condition, it is possible to sufficiently generate the aforementioned replacement reaction while suppressing the destruction of the ring structures contained in the first film.

That is, the aforementioned processing condition is a condition in which N contained in the first film can be replaced with O while at least a part of the ring structures contained in the first film on the wafers 200 is maintained as it is without being destroyed. In other words, the aforementioned processing condition is a condition in which N contained in the first film can be replaced with O while at least a part of a plurality of Si—C bonds constituting the ring structures contained in the first film on the wafers 200 is maintained as it is without being cut.

That is, under the aforementioned condition, it is possible to replace N contained in the first film with O while maintaining at least a part of the ring structures contained in the first film as it is without destroying the same. In other words, it is possible to replace N contained in the first film with O while allowing at least a part of the ring structures contained in the first film to remain in the first film as it is.

Further, as described above, in the first film prior to the $H_2O$ annealing process, N in the state of NH is bonded to Si constituting the ring structures in the film. The Si—N bond in which N in the state of NH is bonded to Si is fragile, so that it becomes a state in which N is easily desorbed. In addition, the Si—C bond constituting the ring structures in the first film is strong, so that it becomes a state in which C is difficult to be desorbed.

By performing the $H_2O$ annealing process on the first film under the aforementioned condition, it is possible to oxidize the first film and generate the replacement reaction in which N contained in the first film is replaced with O contained in the $H_2O$ gas while maintaining at least a part of the ring structures (Si—C bonds) composed of Si and C, which are contained in the first film. At this time, N or Cl contained in the first film is desorbed together with H from the first film. By oxidizing the first film with the $H_2O$ gas in this way, it is possible to modify the first film containing the ring structure and N into the second film containing the ring structure and O. The second film is a SiOC film or a SiOCN film, that is, a SiOC(N) film. Further, by oxidizing the first film with the $H_2O$ gas in this way, Cl and N having a weak bond can be desorbed from the first film, thereby eliminating the hygroscopic sites in the first film. Therefore, when the second film is exposed to the atmosphere after the $H_2O$ annealing process, it is possible to suppress the absorption and adsorption of water contained in the atmosphere into the second film. On the other hand, during the $H_2O$ annealing process, water is absorbed to the second film, whereby the second film contains water. Therefore, the dielectric constant of the second film increases.

Same-Pressure $N_2$ Purging Step

After the $H_2O$ annealing step is completed, in a state in which the wafers 200 with the second film formed on the surface thereof are accommodated in the process chamber 201, at a second pressure at which the $H_2O$ gas remaining in the process chamber 201 is maintained in a gaseous state, an $N_2$ gas is supplied into the process chamber 201 and exhausted from the exhaust pipe 231, thereby purging the interior of the process chamber 201. Specifically, the set pressure (pressure set value) in the process chamber 201 is set to a second pressure, and the $N_2$ gas is supplied from each of the gas supply pipes 232c and 232d into the process chamber 201 and exhausted from the exhaust pipe 231, while adjusting (changing) the opening degree of the APC valve 244, namely, controlling (adjusting) the pressure of the interior of the process chamber 201 such that the actual pressure of the interior of the process chamber 201 becomes the second pressure. The flow rate of the $N_2$ gas is adjusted by the MFCs 241c and 241d. The $N_2$ gas is supplied into the process chamber 201 via the nozzles 249a and 249b, and is exhausted from the exhaust pipe 231. As a result, the interior of the process chamber 201 is purged with the $N_2$ gas. While substituting the $H_2O$ gas remaining in the process chamber 201 with the $N_2$ gas, the $H_2O$ gas, the reaction by-products and the like, which remain in the process chamber 201, are removed from the interior of the process chamber 201.

An example of a processing condition in this step will be described as follows.
   Processing temperature: 200 to 600 degrees C., specifically 250 to 500 degrees C.
   Processing pressure (second pressure): 1,333 to 101,325 Pa, specifically 53,329 to 101,325 Pa, more specifically 53,329 to 79,993 Pa
   $N_2$ gas supply flow rate: 100 to 10,000 sccm
   $N_2$ gas supply time: 10 to 360 minutes, specifically 60 to 360 minutes It is desirable that the processing temperature and the processing pressure (second pressure) in this step are substantially the same as the processing temperature and the processing pressure (first pressure) in the $H_2O$ annealing step.

In particular, it is desirable that the processing pressure (second pressure) in this step is substantially the same as the processing pressure (first pressure) in the $H_2O$ annealing step described above, whereby the $H_2O$ gas remaining in the process chamber 201 can be discharged in the gaseous state as it is to the exterior of the process chamber 201, and the interior of the process chamber 201 can be replaced with the $N_2$ gas.

As used herein, the expression that the second pressure is substantially the same as the first pressure means that the processing pressure (second pressure) in this step is similar or equivalent to, more specifically identical to the processing pressure (first pressure) in the $H_2O$ annealing step. Furthermore, in order to set the second pressure to such a pressure, the set pressure of the interior of the process chamber 201 in this step needs to be made similar or equivalent to, more specifically identical to the set pressure in the process chamber 201 in the $H_2O$ annealing step.

Specifically, it is assumed that substantially the same pressure includes about ±5% of a reference pressure. By setting the second pressure to substantially the same pressure as the first pressure, it is possible to suppress the liquefaction phenomenon and the solidification phenomenon of the $H_2O$ gas remaining in the process chamber 201 as described above. In addition, since there is no need to change the pressure in the process chamber 201 after the $H_2O$ annealing process, it is possible to shorten the process time and increase the throughput, i.e., the productivity accordingly.

In other words, the processing pressure (second pressure) in this step is a processing pressure higher than the processing pressure in a vacuum-exhausting step described later, and is a pressure at which the $H_2O$ gas remaining in the process chamber 201 is not liquefied or solidified. That is, the processing condition in this step is a condition that can avoid the generation of water droplets or ice due to the liquefaction and solidification of the $H_2O$ gas remaining in the process chamber 201.

By purging (replacing) the interior of the process chamber 201 with the $N_2$ gas under the aforementioned condition, prior to depressurization in the vacuuming step described later, it is possible to exhaust the $H_2O$ gas in a gaseous state while suppressing the liquefaction and solidification of the $H_2O$ gas remaining in the process chamber 201. In this way, by exhausting the $H_2O$ gas remaining in the process chamber 201 in a gaseous state without changing the phase thereof, it is possible to suppress the generation of water droplets or ice due to the liquefaction and solidification of the $H_2O$ gas, and suppress the collision of water droplets or ice with the films formed on the surface of the wafers 200, the surfaces of the boat pillars 217a, and the like. This makes it possible to suppress the generation of film peeling or the like caused by the collision of water droplets or ice with these films, and the resultant generation of foreign substances.

The aforementioned processing condition, particularly the temperature condition is a condition in which at least a part of a plurality of ring structures contained in the second film on the wafers 200 is maintained as it is without being destroyed. In other words, the aforementioned processing condition is a condition in which at least a part of a plurality of Si—C bonds constituting a plurality of ring structures contained in the second film on the wafers 200 is maintained as it is without being cut.

Vacuuming Step

After the same-pressure $N_2$ purging step is completed, the interior of the process chamber 201 is subsequently vacuumed in a state in which the wafers 200 with the second film formed on the surface thereof are accommodated in the process chamber 201, so as to reduce a pressure of the interior of the process chamber 201 to a third pressure lower than the second pressure. Specifically, while fully opening the APC valve 244, the interior of the process chamber 201 is vacuumed (depressurization-exhausted) by the vacuum pump 246. That is, the vacuuming of the interior of the process chamber 201 is performed in a state in which the opening degree of the APC valve 244 is fixed and the interior of the process chamber 201 is fully vacuumed. At this time, an $N_2$ gas may be supplied into the process chamber 201 from each of the gas supply pipes 232c and 232d and may be exhausted from the exhaust pipe 231. However, in this case, in order to efficiently reduce the pressure in the process chamber 201, it is desirable that the supply flow rate of the $N_2$ gas is smaller than the supply flow rate of the $N_2$ gas in the same-pressure $N_2$ purging step.

An example of a processing condition in this step is described as follows.
   Processing temperature: 200 to 600 degrees C., specifically 250 to 500 degrees C.
   Processing pressure (third pressure): 1 to 100 Pa, specifically 1 to 50 Pa
   $N_2$ gas supply flow rate: 0 to 1,000 sccm
   Vacuuming time: 10 to 360 minutes, specifically 60 to 360 minutes It is desirable that the processing temperature in this step is substantially the same as the processing temperature in the $H_2O$ annealing step and the same-pressure $N_2$ purging step.

By vacuuming the interior of the process chamber 201 under the aforementioned condition, it is possible to remove the residual $H_2O$ gas that was not completely removed from the interior of the process chamber 201 in the same-pressure $N_2$ purging step. In the same-pressure $N_2$ purging step, most of the $H_2O$ gas remaining in the process chamber 201 can be removed from the process chamber 201. However, the $H_2O$ gas may remain in the process chamber 201 without being completely removed. By carrying out this step under the aforementioned condition, the residual $H_2O$ gas remaining in the process chamber 201 without being completely removed in the same-pressure $N_2$ purging step can be removed from the process chamber 201. Since most of the residual $H_2O$ gas remaining in the process chamber 201 is removed in the same-pressure $N_2$ purging step, an abundance ratio of the $H_2O$ gas in the process chamber 201 is extremely small at the start of this step. Therefore, even if the vacuuming is performed in this step, the generation of foreign substances is suppressed. Furthermore, this step can be performed without controlling the pressure of the interior of the process chamber 201 by fixing the opening degree of the APC valve 244. Therefore, it is possible to simplify the control of the substrate processing process.

Further, the aforementioned processing condition, particularly the temperature condition is a condition in which at least a part of a plurality of ring structures contained in the second film on the wafers 200 is maintained as it is without being destroyed. In other words, the aforementioned processing condition is a condition in which at least a part of a plurality of Si—C bonds constituting a plurality of ring structures contained in the second film on the wafers 200 is maintained as it is without being cut.

Further, it is desirable that the $H_2O$ annealing step, the same-pressure $N_2$ purging step, and the vacuuming step are performed at a similar or equivalent processing temperature, more specifically at the identical processing temperature to each other. That is, it is desirable that the $H_2O$ annealing step, the same-pressure $N_2$ purging step and the vacuuming step are performed in a state in which the temperature of the wafers 200 is set to a similar or equivalent temperature, more specifically an identical temperature to each other. Furthermore, it is desirable that the film-forming step, the $H_2O$ annealing step, the same-pressure $N_2$ purging step, and the vacuuming step are performed at a similar or equivalent processing temperature, more specifically at an identical processing temperature to each other. That is, it is desirable that the film-forming step, the $H_2O$ annealing step, the same-pressure $N_2$ purging step, and the vacuuming step are performed in a state in which the temperature of the wafers 200 is set to a similar or equivalent temperature, more specifically an identical temperature. In these cases, the step of changing the temperature of the wafers 200 becomes unnecessary. Therefore, it is possible to shorten the process time and to increase the throughput, that is, the productivity accordingly.

$N_2$ Annealing Step

After the vacuuming step is completed, an $N_2$ annealing process as a thermal annealing process is subsequently performed on the wafers 200 in the process chamber 201, that is, the second film formed on each of the wafers 200, in a state in which the wafers 200 with the second film formed on the surface thereof are accommodated in the process chamber 201. At this time, an $N_2$ gas is supplied into the process chamber 201 from each of the gas supply pipes 232c and 232d, and is exhausted from the exhaust pipe 231. The flow rate of the $N_2$ gas is adjusted by the MFCs 241c and 241d. The $N_2$ gas is supplied into the process chamber 201 via the nozzles 249a and 249b, respectively, and is exhausted from the exhaust pipe 231. At this time, the $N_2$ gas is supplied to the wafers 200.

An example of a processing condition in this step is described as follows.

Processing temperature: 300 to 800 degrees C., specifically 400 to 700 degrees C.
Processing pressure: 67 to 101,325 Pa
$N_2$ gas supply flow rate: 1,000 to 5,000 sccm
Supply time: 10 to 120 minutes The aforementioned processing condition is a condition in which water contained in the second film can be desorbed while at least a part of ring structures contained in the second film formed in the $H_2O$ annealing step and composed of Si and C is retained (maintained) as it is without being destroyed. That is, the aforementioned processing condition is a condition in which water contained in the second film can be desorbed while at least a part of ring structures contained in the second film on the wafers 200 is maintained as it is without being destroyed. In other words, the aforementioned processing condition is a condition in which water contained in the second film can be desorbed while at least a part of Si—C bonds constituting a plurality of ring structures contained in the second film on the wafers 200 is maintained as it is without being cut.

By performing the $N_2$ annealing process on the second film under the aforementioned condition, the $H_2O$ gas contained in the second film can be desorbed and removed while at least a part of ring structures (Si—C bonds) composed of Si and C and contained in the second film is maintained as it is. The $N_2$ annealing step is also referred to as water removal step.

That is, in the $N_2$ annealing step, the $H_2O$ gas physically absorbed to the film in the $H_2O$ annealing step is desorbed. This makes it possible to reduce the dielectric constant of the second film after the $N_2$ annealing process. Furthermore, by the series of processes from the $H_2O$ annealing step to the $N_2$ annealing step, it is possible to eliminate the moisture absorption sites on the second film after performing the $N_2$ annealing process, that is, the SiOC(N) film finally formed on the wafers 200. When the film is exposed to the atmosphere, it is possible to suppress the absorption and adsorption of the water contained in the atmosphere into the film.

In the present embodiment, the film-forming step, the $H_2O$ annealing step, the same-pressure $N_2$ purging step, the vacuuming step, and the $N_2$ annealing step are continuously performed in this order in the same process chamber 201 in situ. In this case, it is possible to continuously perform these series of processes without exposing the film formed on the wafers 200 to the atmosphere. As a result, it is possible to improve the controllability of the process performed in each step. In addition, it is possible to improve the throughput, that is, the productivity.

After-Purge and Atmospheric Pressure Restoration

After the $N_2$ annealing step is completed, an $N_2$ gas is supplied into the process chamber 201 from each of the gas supply pipes 232c and 232d, and is exhausted from the exhaust pipe 231. As a result, the interior of the process chamber 201 is purged. The gas, the reaction by-product and the like remaining in the process chamber 201 are removed from the interior of the process chamber 201 (after-purge). Thereafter, the gas in the process chamber 201 is replaced with the inert gas (inert gas replacement), and the pressure in the process chamber 201 is restored to the atmospheric pressure (atmospheric pressure restoration).

Boat Unloading and Wafer Discharging

Thereafter, the seal cap 219 is lowered by the boat elevator 115, and the lower end of the reaction tube 203 is opened. Then, the processed wafers 200 are unloaded from the reaction tube 203 through the lower end of the reaction tube 203 while being supported by the boat 217 (boat unloading). The processed wafers 200 are taken out from the boat 217 after they are unloaded from the reaction tube 203 (wafer discharging).

(3) Effect of the Present Embodiment

According to the present embodiment, one or more of the following effects may be obtained.

(a) In the same-pressure $N_2$ purging step, the $H_2O$ gas remaining in the process chamber 201 can be discharged in a gaseous state, so that it is possible to remove the same from the process chamber 201. As a result, it is possible to suppress the occurrence of peeling of the films formed on the surfaces of the wafers, the surfaces of the boat pillars, and the like, and the resultant generation of foreign substances.

(b) In the same-pressure $N_2$ purging step, it is not necessary to change the pressure of the interior of the process chamber 201. Therefore, it is possible to shorten the process time and to increase the throughput, that is, the productivity accordingly.

(c) In the same-pressure $N_2$ purging step, it is possible to make an abundance ratio of the $H_2O$ gas in the process chamber 201 extremely small by removing most of the $H_2O$ gas remaining in the process chamber 201. As a result, it is possible to suppress the generation of foreign substances in the subsequent vacuuming step.

(d) In the vacuuming step, the residual $H_2O$ gas that was not completely removed from the interior of the process chamber 201 in the same-pressure $N_2$ purging step can be removed while suppressing the generation of foreign substances.

(e) In the vacuuming step, it is not necessary to control the pressure in the process chamber 201. This makes it possible to simplify the control of the substrate processing process.

(f) The film-forming step, the $H_2O$ annealing step, the same-pressure $N_2$ purging step, the vacuuming step, and the $N_2$ annealing step are continuously performed in-situ in the this order, whereby it is possible to continuously perform these series of processes without exposing the film formed on the wafers 200 to the atmosphere. As a result, it is possible to improve the controllability of the process performed in each step. In addition, it is possible to improve the throughput, that is, the productivity.

(g) By the series of processes from the $H_2O$ annealing to the $N_2$ annealing, it is possible to eliminate the hygroscopic sites of the film finally formed on the wafers 200. When the film is exposed to the atmosphere, it is possible to suppress the absorption or adsorption of the water contained in the atmosphere into the film.

(h) The aforementioned effects may be similarly obtained even when a precursor gas other than the TCDSCB gas is used, even when a reaction gas other than the $NH_3$ gas is used, or even when an inert gas other than the $N_2$ gas is used.

Other Embodiments

The embodiment of the present disclosure has been specifically described above. However, the present disclosure is not limited to the above-described embodiment, and various changes may be made without departing from the spirit thereof.

For example, as in the process sequence shown below, a step of supplying an $O_2$ gas as an oxidizing agent may be added to the film-forming step described above. That is, the cycle in the above-described film-forming step may further include a step of supplying an $O_2$ gas. In this process sequence, there is shown an example in which the step of supplying the $O_2$ gas is performed non-simultaneously with each of the step of supplying the TCDSCB gas and the step of supplying the $NH_3$ gas. Also in this case, the same effects as those of the process sequence shown in FIG. 4 can be obtained. In this case, it is possible to control the composition ratio of the SiOC(N) film finally formed on the wafers 200, for example, in an O-rich direction.

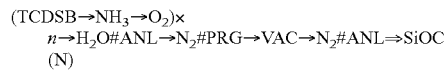

As the oxidizing agent, for example, a nitrous oxide ($N_2O$) gas, a nitric oxide (NO) gas, a $H_2O$ gas, or a $H_2$ gas+$O_2$ gas may be used instead of the $O_2$ gas.

Further, for example, as in the process sequences shown below, a silicon oxynitride film (SiON film), a silicon oxycarbonitride film (SiOCN film), a silicon oxycarbide film (SiOC film), a silicon oxide film (SiO film), and the like may be formed on each of the wafers 200. That is, as the precursor (precursor gas), instead of the TCDSCB gas, it may be possible to use a precursor gas that does not contain a ring structure, for example, a halosilane (chlorosilane) precursor gas such as a hexachlorodisilane ($Si_2Cl_6$, abbreviation: HCDS) gas or the like, an alkylhalosilane (alkylchlorosilane) precursor gas such as a 1,1,2,2-tetrachloro-1,2-dimethyldisilane (($CH_3)_2Si_2Cl_4$, abbreviation: TCDMDS) gas or the like, and an aminosilane precursor gas such as a trisdimethylaminosilane ($Si[N(CH_3)_2]_3H$, abbreviation: 3DMAS) gas or a bisdiethylaminosilane ($SiH_2[N(C_2H_5)_2]_2$, abbreviation: BDEAS) gas. Moreover, as the precursor (precursor gas), it may be possible to use a precursor gas containing a Si—C bond and a Si—H bond such as a 1,4-disilabutane ($SiH_3CH_2CH_2SiH_3$, abbreviation: 1,4-DSB) gas or the like, and a precursor gas containing a Si—N bond and a Si—H bond such as a trisilylamine ($N(SiH_3)_3$, abbreviation: TSA) gas or the like. In addition, as the reactant (reaction gas), instead of the $NH_3$ gas, it may be possible to use, for example, an amine-based gas such as a triethylamine (($C_2H_5)_3N$, abbreviation: TEA) gas or the like, an O-containing gas (oxidizing agent) such as an oxygen ($O_2$) gas, an ozone ($O_3$) gas, a plasma-excited $O_2$ gas ($O_2$*), an $O_2$ gas+hydrogen ($H_2$) gas or the like, a C-containing gas such as a propylene ($C_3H_6$) gas or the like, and a B-containing gas such as a trichloroborane ($BCl_3$) gas or the like.

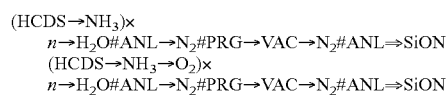
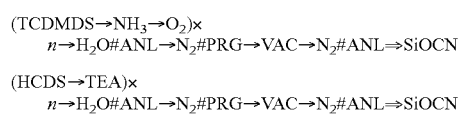

(HCDS→TEA→O₂)×
    n→H₂O#ANL→N₂#PRG→VAC→N₂#ANL⇒SiOC
    (N)

(HCDS→C₃H₆→NH₃)×
    n→H₂O#ANL→N₂#PRG→VAC→N₂#ANL⇒SiOCN (HCDS→C₃H₆→NH₃→O₂)×
    n→H₂O#ANL→N₂#PRG→VAC→N₂#ANL⇒SiOCN (BCl₃→DSB→TSA→O₂)×
    n→H₂O#ANL→N₂#PRG→VAC→N₂#ANL⇒SiOCN (HCDS→O₂+H₂)×
    n→H₂O#ANL→N₂#PRG→VAC→N₂#ANL⇒SiO (3DMAS→O₃)×
    n→H₂O#ANL→N₂#PRG→VAC→N₂#ANL⇒SiO (BDEAS→O₂*)×
    n→H₂O#ANL→N₂#PRG→VAC→N₂#ANL⇒SiO

In these process sequences, the same effects as those in the process sequence shown in FIG. 4 can be obtained. The process procedure and the processing conditions for supplying the precursor or the reactant may be the same as those of the process sequence shown in FIG. 4.

Further, as the precursor (precursor gas), instead of the TCDSCB gas, it may be possible to use a precursor gas that does not contain a ring structure, for example, a titanium tetrachloride (TiCl₄) gas or a trimethylaluminum (Al(CH₃)₃, abbreviation: TMA) gas. As the reactant (reaction gas), instead of the NH₃ gas, it may be possible to use, for example, an O-containing gas (oxidizing agent) such as an O₂ gas, an O₃ gas or an H₂O gas. By the process sequences shown below, a titanium oxide film (TIO film), a titanium oxynitride film (TION film), an aluminum oxide film (AlO film), an aluminum oxynitride film (AlON film) or the like may be formed on the substrate.

(TiCl₄→H₂O)×
    n→H₂O#ANL→N₂#PRG→VAC→N₂#ANL⇒TiO (TiCl₄→NH₃)×
    n→H₂O#ANL→N₂#PRG→VAC→N₂#ANL⇒TiON (TiCl₄→NH₃→O₂)×
    n→H₂O#ANL→N₂#PRG→VAC→N₂#ANL⇒TiON (TMA→O₃)×
    n→H₂O#ANL→N₂#PRG→VAC→N₂#ANL⇒AlO (TMA→NH₃)×
    n→H₂O#ANL→N₂#PRG→VAC→N₂#ANL⇒AlON (TMA→NH₃→O₂)×
    n→H₂O#ANL→N₂#PRG→VAC→N₂#ANL⇒AlON

In these process sequences, the same effects as those in the process sequence shown in FIG. 4 can be obtained. The process procedure and the processing conditions for supplying the precursor and the reactant may be the same as those of the process sequence shown in FIG. 4.

As described above, the present disclosure may be suitably applied to not only the case where a film containing a metalloid element such as Si or the like as a main element is formed, but also the case where a film containing a metal element such as Ti or Al as a main element is formed on a substrate. The present disclosure may also be suitably applied to the case where a film containing a metalloid element such as germanium (Ge), boron (B) or the like as a main element in addition to Si is formed. In addition, the present disclosure may be suitably applied to the case where a film containing a metal element such as zirconium (Zr), hafnium (Hf), niobium (Nb), tantalum (Ta), molybdenum (Mo), tungsten (W), yttrium (Y), lanthanum (La), strontium (Sr) or the like as a main element in addition to Ti and Al is formed.

It is desirable that the recipe used for the substrate processing are prepared separately according to the process contents and are stored in the memory device 121c via an electric communication line or an external memory device 123. When starting the substrate processing process, it is desirable that the CPU 121a properly selects an appropriate recipe from a plurality of recipes stored in the memory device 121c according to the contents of the substrate processing process. This makes it possible to form films of various film types, composition ratios, film qualities and film thicknesses with high reproducibility in one substrate processing apparatus. In addition, the burden on an operator can be reduced, and the process can be quickly started while avoiding operation errors.

The above-described recipes are not limited to the newly-prepared ones, but may be prepared by, for example, changing the existing recipes already installed in the substrate processing apparatus. In the case of changing the recipes, the recipes after the change may be installed in the substrate processing apparatus via an electric communication line or a recording medium in which the recipes are recorded. In addition, the input/output device 122 provided in the existing substrate processing apparatus may be operated to directly change the existing recipes already installed in the substrate processing apparatus.

In the above-described embodiments, there has been described the example in which the film is formed using the batch type substrate processing apparatus for processing a plurality of substrates at a time. The present disclosure is not limited to the above-described embodiments, but may be suitably applied to, for example, a case where a film is formed using a single-wafer type substrate processing apparatus for processing one or several substrates at a time. Furthermore, in the above-described embodiments, there has been described the example in which the film is formed using the substrate processing apparatus having a hot wall type process furnace. The present disclosure is not limited to the above-described embodiments, but may also be suitably applied to a case where a film is formed using a substrate processing apparatus having a cold wall type process furnace.

Even in the case of using these substrate processing apparatuses, the substrate processing process may be performed under the same process procedures and processing condition as those in the above-described embodiment and modifications, and the same effects as those of the above-described embodiment and modifications may be obtained.

In addition, the above-described embodiments and modifications may be used in combination as appropriate. The process procedures and processing conditions at this time may be the same as, for example, the process procedures and processing conditions of the above-described embodiments.

Hereinafter, Examples will be described.

EXAMPLES

As Sample 1, by using the substrate processing apparatus shown in FIG. 1, a SiOCN film was formed on a wafer according to the substrate processing sequence shown in FIG. 4. The processing conditions were set to a predetermined condition that fall within the processing condition range of the above-described embodiment. As Sample 2, by using the substrate processing apparatus shown in FIG. 1, a SiOCN film was formed on a wafer according to a substrate processing sequence in which after the H₂O annealing step of the substrate processing sequence shown in FIG. 4, the vacuuming step is immediately performed without performing the same-pressure $N_2$ purging step. The processing condition was set to a predetermined condition that falls within the processing condition range of the above-described embodiment. Then, the number of particles adhering to each of the SiOCN films of Sample 1 and Sample 2 was counted.

Figure 6:
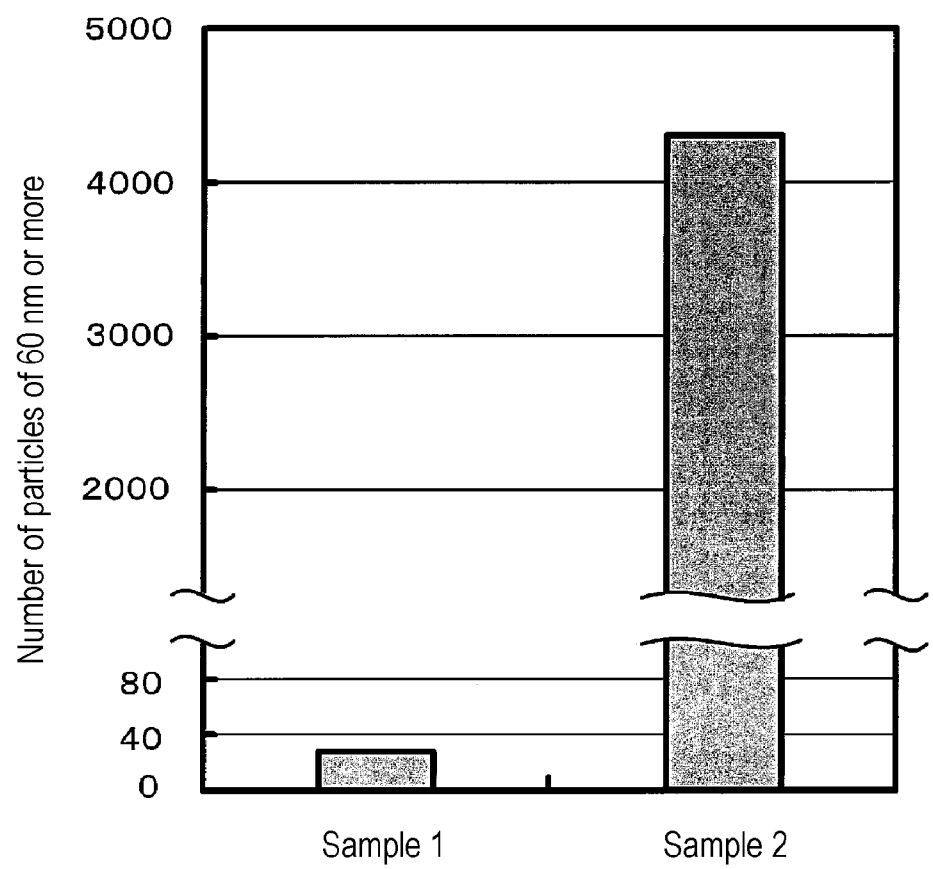
FIG. 6 is a diagram comparatively showing the number of particles on a film formed on a wafer by the substrate processing sequence of an embodiment of the present disclosure and the number of particles on a film formed on a wafer by a substrate processing sequence of a comparative example.

FIG. 6 is a diagram comparatively showing the numbers of particles having a size of 60 nm or more, which adhere to the respective SiOCN films of Sample 1 and Sample 2.

As shown in FIG. 6, the number of particles on the SiOCN film of Sample 2 that did not undergo the same-pressure $N_2$ purging step was 4000 or more. On the other hand, the number of particles on the SiOCN film of Sample 1 after performing the same-pressure $N_2$ purging step was 40 or less. That is, it was confirmed that the number of particles can be dramatically reduced and the generation of foreign substances can be remarkably suppressed by performing the same-pressure $N_2$ purging step and the vacuum evacuation step after the $H_2O$ annealing step.

According to the present disclosure in some embodiments, it is possible to suppress the generation of foreign substances caused by a gas containing hydrogen and oxygen.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   (a) modifying a film formed on a substrate in a process chamber set at a first pressure by supplying a gas containing hydrogen and oxygen to the film;
   (b) purging an interior of the process chamber by supplying an inert gas into the process chamber and exhausting the interior of the process chamber, at a second pressure at which the gas containing hydrogen and oxygen remaining in the process chamber after performing (a) is maintained in a gaseous state;
   (c) vacuuming the interior of the process chamber so as to reduce a pressure of the interior of the process chamber after performing (b) to a third pressure lower than the second pressure; and
   (e) before performing (a), forming a film containing nitrogen and a ring structure composed of silicon and carbon as the film formed on the substrate by performing a cycle a predetermined number of times, the cycle including non-simultaneously performing:
       supplying a precursor gas containing the ring structure and halogen to the substrate in the process chamber; and
       supplying a nitriding agent to the substrate in the process chamber.

2. The method of claim 1, wherein the second pressure in (b) is a pressure at which the gas containing hydrogen and oxygen remaining in the process chamber is not liquefied or solidified.

3. The method of claim 1, wherein a set pressure of the interior of the process chamber in (b) is set to be equal to a set pressure of the interior of the process chamber in (a).

4. The method of claim 1, wherein (a) and (b) are performed while feedback-controlling an exhaust valve that is installed at an exhaust pipe configured to exhaust the interior of the process chamber, and (c) is performed without feedback-controlling the exhaust valve.

5. The method of claim 1, wherein (a) and (b) are performed while controlling the pressure of the interior of the process chamber, and (c) is performed in a state in which an exhaust valve that is installed at an exhaust pipe configured to exhaust the interior of the process chamber is fully opened.

6. The method of claim 1, wherein (a) and (b) are performed while adjusting an opening degree of an exhaust valve installed at an exhaust pipe that is configured to exhaust the interior of the process chamber, and (c) is performed without adjusting the opening degree of the exhaust valve.

7. The method of claim 1,
   wherein the first pressure in (a) is set to be higher than a pressure of the interior of the process chamber in (e).

8. The method of claim 7, wherein (e), (a), (b), and (c) are performed at a same processing temperature.

9. The method of claim 1, wherein the first pressure in (a) is 1,333 Pa or more and 101,325 Pa or less.

10. The method of claim 1, wherein (a), (b), and (c) are performed at a same processing temperature.

11. The method of claim 1, further comprising: (d) thermally annealing, after performing (c), the film after being modified.

12. The method of claim 11, wherein the gas containing hydrogen and oxygen, which remains in the process chamber by performing (a), is removed in (b) and (c), and
   wherein the gas containing hydrogen and oxygen, which is physically absorbed into the film by performing (a), is desorbed in (d).

13. The method of claim 1, wherein the cycle further includes performing supplying an oxidizing agent to the substrate in the process chamber, which is non-simultaneously performed with each of the act of supplying the precursor gas and the act of supplying the nitriding agent.

14. The method of claim 1, further comprising:
   (d) thermally annealing, after performing (c), the film after being modified,
   wherein (e), (a), (b), (c), and (d) are performed under a condition in which the ring structure contained in the precursor gas is maintained without being destroyed.

15. The method of claim 1, further comprising:
   (d) thermally annealing, after performing (c), the film after being modified,
   wherein (e), (a), (b), (c), and (d) are performed under a condition in which a chemical bond of silicon and carbon constituting the ring structure contained in the precursor gas is maintained without being cut.

16. The method of claim 1, further comprising:
   (d) thermally annealing, after performing (c), the film after being modified, and
   wherein (e), (a), (b), (c), and (d) are sequentially performed continuously in the process chamber.

17. A substrate processing method, comprising:
   (a) modifying a film formed on a substrate in a process chamber set at a first pressure by supplying a gas containing hydrogen and oxygen to the film;
   (b) purging an interior of the process chamber by supplying an inert gas into the process chamber and exhausting the interior of the process chamber, at a second pressure at which the gas containing hydrogen and oxygen remaining in the process chamber after performing (a) is maintained in a gaseous state;

(c) vacuuming the interior of the process chamber so as to reduce a pressure of the interior of the process chamber after performing (b) to a third pressure lower than the second pressure; and (e) before performing (a), forming a film containing nitrogen and a ring structure composed of silicon and carbon as the film formed on the substrate by performing a cycle a predetermined number of times, the cycle including non-simultaneously performing:

supplying a precursor gas containing the ring structure and halogen to the substrate in the process chamber; and supplying a nitriding agent to the substrate in the process chamber.

* * * * *